(12) United States Patent
Zhang et al.

(10) Patent No.: US 7,893,406 B1
(45) Date of Patent: Feb. 22, 2011

(54) ELECTRON GUN WITH MAGNETIC IMMERSION DOUBLE CONDENSER LENSES

(75) Inventors: Xu Zhang, Hayward, CA (US); Zhong-Wei Chen, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 772 days.

(21) Appl. No.: 11/476,411

(22) Filed: Jun. 27, 2006

Related U.S. Application Data

(60) Provisional application No. 60/695,815, filed on Jun. 29, 2005.

(51) Int. Cl.
*H01J 1/50* (2006.01)

(52) U.S. Cl. .......................... 250/396 ML; 250/492.2; 250/396 R

(58) Field of Classification Search ........................ None
See application file for complete search history.

(56) References Cited

U.S. PATENT DOCUMENTS

| | | | |
|---|---|---|---|
| 4,315,152 A * | 2/1982 | Smith | 250/396 ML |
| 4,544,845 A | 10/1985 | Michel | |
| 4,963,823 A * | 10/1990 | Otto et al. | 324/751 |
| 5,371,371 A * | 12/1994 | Yamazaki et al. | 250/396 R |
| 5,548,183 A * | 8/1996 | Miyoshi et al. | 313/153 |
| 5,578,821 A * | 11/1996 | Meisberger et al. | 250/310 |
| 5,633,507 A * | 5/1997 | Pfeiffer et al. | 250/492.23 |
| 5,895,919 A | 4/1999 | Frosien et al. | |
| 6,392,333 B1* | 5/2002 | Veneklasen et al. | 313/361.1 |
| 7,067,807 B2* | 6/2006 | Petrov et al. | 250/307 |
| 2002/0060573 A1* | 5/2002 | Sakawa et al. | 324/614 |
| 2006/0049348 A1* | 3/2006 | Petrov et al. | 250/307 |

FOREIGN PATENT DOCUMENTS

| | | | |
|---|---|---|---|
| JP | 07192674 A * | 7/1995 | |
| JP | 2000003689 A * | 1/2000 | |

OTHER PUBLICATIONS

J. Orloff et al. "An asymmetric electrostatic lens for field-emission microprobe applications", J. App. Phys. 50 (1979) 2494-2501.

A. Delong et al. "A new design of field emission electron gun with a magnetic lens", Optik 81, No. 3 (1989) 103-108.

* cited by examiner

*Primary Examiner*—Jack I Berman
*Assistant Examiner*—Andrew Smyth
(74) *Attorney, Agent, or Firm*—Kilpatrick Townsend & Stockton LLP

(57) ABSTRACT

An electron gun comprises an electron emitter, an electrode surrounding the electron emitter, an extraction electrode, and a double condenser lens assembly, the double condenser lens assembly comprising a magnetic immersion pre-condenser lens and a condenser lens. In combination with a probe forming objective lens, the electron gun apparatus can provide an electron beam of independently adjustable probe size and probe current, as is desirable in electron beam applications. The electron emitter is immersed in the magnetic field generated by a magnetic type pre-condenser lens. When activated, the pre-condenser lens collimates the beam effectively to increase its angular intensity while at the same time enlarging the virtual source as compared with non-immersion case, due to geometric magnification and aberrations of its lens action. The pre-condenser lens is followed by a condenser lens. If the condenser lens is of the magnetic type, its peak magnetic field is far enough away and thus its action does not significantly affect the size of the virtual source. Independent adjustment of the lenses, combined with suitable selection of final probe forming objective aperture size, allows various combination of the final probe size and probe current to be obtained in a range sufficient for most electron beam applications.

16 Claims, 3 Drawing Sheets

ELECTRON GUN WITH MAGNETIC IMMERSION DOUBLE CONDENSER LENSES

CROSS-REFERENCE TO RELATED APPLICATION

The instant nonprovisional patent application claims priority to U.S. Provisional Patent Application No. 60/695,815, filed Jun. 29, 2006 and incorporated by reference herein for all purposes.

BACKGROUND OF THE INVENTION

An electron gun (i.e. electron beam generation and collimating apparatus) is a component of a variety of different instruments, including but not limited to electron microscopes and electron beam lithography devices. The thermal field emission type and the cold field emission type electron guns are becoming the most commonly used owing to their suitability for medium to high resolution imaging and probe forming applications.

Such an electron gun typically includes a needle pointed electron emitter surrounded by a suppressor or a shielding electrode, an extraction electrode, a post-extraction accelerator, and a post-extraction condenser lens. In a traditional electron gun design, typically only one electrostatic type condenser lens is used, and is positioned after the extraction electrode. The electric field between the electron emitter and the extraction electrode determines the electron trajectory leaving the extractor electrode. From the point of view of the condenser lens, the emitter in effect acts as a virtual source of the electron beam, positioned at a fixed distance behind the emitter surface, with a finite equivalent emission area or source size. This source size is the combined result of the linear magnification of the actual emission area on the emitter surface, and trajectory aberrations induced by the lens actions of the extraction field.

In such a conventional arrangement, the source size cannot be changed with respect to the condenser lens. This is because the voltage difference between the electron emitter and the extraction electrode remains to fixed in order to maintain a stable emission current. As a result, when the electron gun is combined with a probe forming objective lens to form an electron probe for applications such as a scanning electron microscope or an electron beam lithography tool, the choice of the combination of the final probe size and probe current becomes limited. Specifically, final probe size and probe current are coupled and determined by the adjustment of the condenser lens and the probe forming lens. In such a case, only a single curve of probe size vs. probe current may be obtained for each beam limiting objective aperture. This is illustrated in FIG. 1, which plots probe size versus probe current for an example of a single aperture.

In electron guns where a magnetic type condenser lens is used in place of the electrostatic type lens, the magnetic field is either far enough from the emitter so that the magnetic field is insignificant to the emitter and thus functionally equivalent to the electrostatic lens, or the emitter is immersed in the magnetic field. For the immersion case, the condenser lens will not only exert collimating action on the electrons post extraction electrode, but also affect electron trajectory before the extraction electrode, causing changes in the virtual source size and its location. As these collimating and trajectory effects are acted upon simultaneously by one lens and cannot be adjusted independently, the benefits of changeable virtual source size cannot be utilized to expand the adjustable range of the final probe size and current. Moreover, this coupling makes determining the actual probe size and current a complex matter.

Achieving greater flexibility and range in the combination of probe sizes and probe currents available to electron beam equipment could be important for many applications. For example, in semiconductor defect inspections, electric voltage contrast imaging demands a suitable choice of probe current and size.

Accordingly, there is a need in the art for improved designs for electron gun apparatuses and methods of forming electron beams.

BRIEF SUMMARY OF THE INVENTION

An electron gun comprises an electron emitter surrounded by a suppressor electrode, an extraction electrode, and a double condenser lens assembly comprising a magnetic immersion pre-condenser lens, and a non-immersion condenser lens. In combination with a probe forming objective lens, the electron gun apparatus can provide an electron beam of independently adjustable probe size and probe current. The electron emitter is immersed in the magnetic field generated by a magnetic type pre-condenser lens. When activated, the magnetic type pre-condenser lens collimates the beam effectively to increase its angular intensity, while at the same time enlarging the virtual source as compared with non-immersion case, owing to the geometric magnification and the aberrations of the lens action. The pre-condenser lens is followed by a condenser lens. If the condenser lens is chosen to be of the magnetic type, its peak magnetic field is positioned far enough away from the emitter and thus the lens action does not significantly affect the size of the virtual source. Independent adjustment of the pre-condenser and condenser lenses, combined with suitable selection of the final probe forming objective aperture size, allows various combination of the final probe size and probe current to be obtained in a range sufficient for most electron beam applications.

An embodiment of an apparatus in accordance with the present invention, comprises, an electron emitter surrounded by an electrode, and an extraction electrode. The apparatus further comprises a double condenser lens assembly comprising, a magnetic immersion type pre-condenser lens configured to generate a magnetic field and immerse the emitter in a strong part of the magnetic field, and a condenser lens following the pre-condenser lens.

An embodiment of a method in accordance with the present invention for generating an electron beam probe, comprises, providing an electron emitter, providing an electrode surrounding the emitter, and providing an extraction electrode. The method further comprises providing a double condenser lens assembly comprising a magnetic immersion type pre-condenser lens followed by a condenser lens, causing the pre-condenser lens to generate a magnetic field and immerse the emitter in a strong part of the magnetic field, and causing the condenser lens to condense the electron beam. A final probe forming objective lens is provided, and the condensed electron beam is focused into a final electron beam probe by the probe forming objective lens.

An embodiment of a method in accordance with the present invention for producing a collimated electron beam, comprises, activating a pre-condenser lens to generate a magnetic field immersing an electron emitter in a strong portion of the magnetic field, and adjusting the pre-condenser lens, a subsequent condenser lens, a probe forming objective lens, and selecting a final probe forming objective aperture, in order to obtain a combination of a final probe size and a probe current.

A further understanding of embodiments in accordance with the present invention can be made by way of reference to the ensuing detailed description taken in conjunction with the accompanying drawings.

DETAILED DESCRIPTION OF THE INVENTION

Embodiments of an electron gun in accordance with the present invention comprise an electron emitter surrounded by a suppressor electrode, an extraction electrode, and a double condenser lens assembly comprising a magnetic immersion pre-condenser lens, and a condenser lens. In combination with a probe forming objective lens, this electron gun apparatus can provide an electron beam of independently adjustable probe size and probe current. Specifically, the electron emitter is immersed in the magnetic field generated by a magnetic type pre-condenser lens. When activated, the magnetic type pre-condenser lens collimates the beam effectively to increase its angular intensity, while at the same time enlarging the virtual source as compared with non-immersion case, owing to the geometric magnification and the aberrations of the lens action. A condenser lens follows the pre-condenser lens. If the condenser lens is chosen to be of the magnetic type, its peak magnetic field is far enough away from the emitter and thus the lens action does not significantly affect the size of the virtual source. Independent adjustment of the pre-condenser and condenser lenses, combined with suitable selection of final probe forming objective aperture size, allows various combination of the final probe size and probe current to be obtained in a range sufficient for most electron beam applications.

Figure 1:
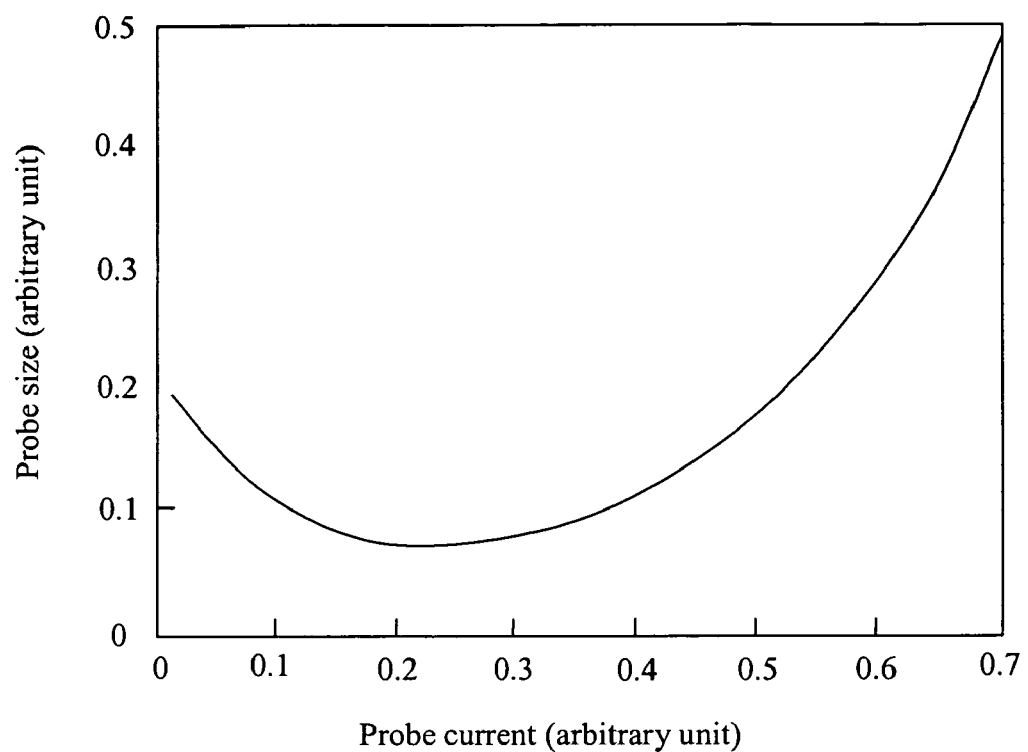
FIG. 1 plots probe size versus probe current for a probe forming device using a conventional electron gun, showing the curve for a single objective aperture as an example.
Figures 2, 2A:
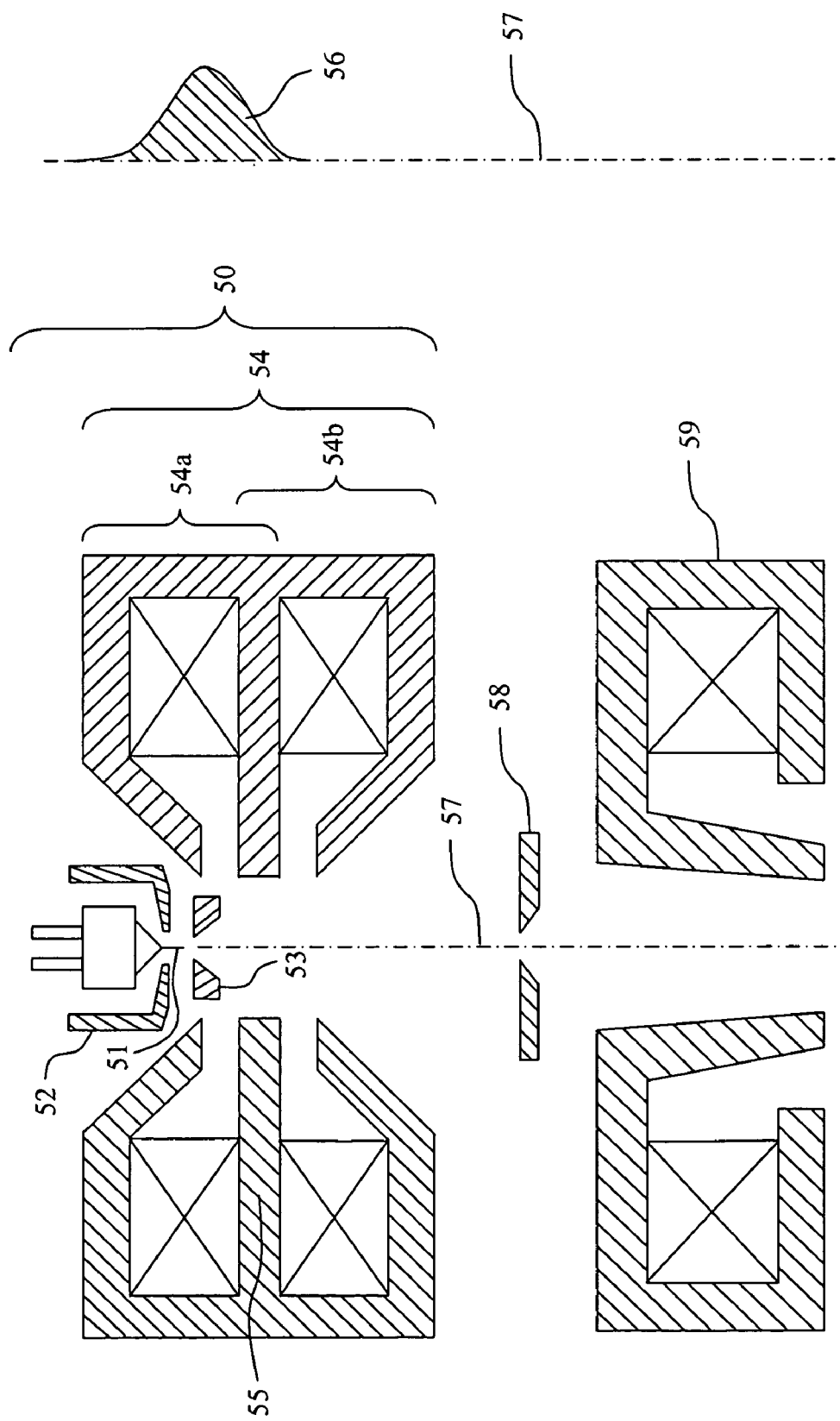
FIG. 2 is a cross-sectional view showing the first embodiment of the electron gun according to the present invention, with double condenser lenses including the magnetic immersion pre-condenser lens and the magnetic condenser lens.
FIG. 2A illustrates distribution of the magnetic field along the center axis of the electron gun of FIG. 2.
Figure 2B:
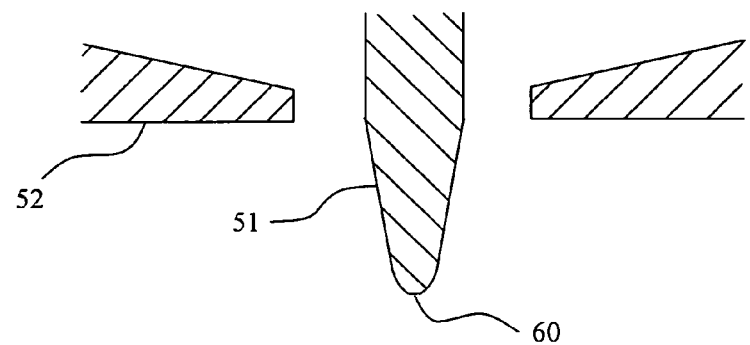
FIG. 2B illustrates an enlarged view of the electron emitter and surrounding suppressor electrode of the embodiment of the electron gun of FIG. 2.

A first embodiment of the electron gun in accordance with the present invention is described with reference to FIGS. 2-2A and 3. FIG. 2 is a cross-sectional view illustrating a first embodiment of the electron gun according to the present invention. Electron gun 50 comprises an electron emitter 51 having a front end or apex 60, a suppressor electrode 52, an extractor electrode 53, and a double condenser lenses assembly 54 including the magnetic immersion pre-condenser lens 54a and a magnetic condenser lens 54b. Shown only as an example in FIG. 2 is the electron emitter 51 as a Zirconated Tungsten (ZrW/O) Schottky emitter.

In operation, the emitter 51 is negatively biased at a fixed high voltage with respect to the extractor 53 so that electrons are extracted and accelerated from the emitter. For this particular embodiment, no post-extractor accelerator is employed. Thus the extractor is set at the same ground potential as the condenser lens assembly 54, and the electrons attain their full velocity in the instrument by passing through the extractor. In accordance with other embodiments, a post-extractor accelerator positioned after the extractor electrode 53 could be used.

The pre-condenser 54a is positioned so that the emitter 51 is immersed in the strong part of the magnetic field generated by the pre-condenser 54a, with the peak of its magnetic field distribution at only a few millimeters in front of the apex of the emitter 51. FIG. 2A shows intensity of the magnetic field along the center axis of the electron gun. The shaded area 56 in FIG. 2A illustrates the magnetic field distribution along the center axis 57 of the electron gun. In this way the magnetic field is effectively utilized, which reduces the amount of the lens excitation coil current required, and in turn contributes to lower heat generation.

The configuration specifically illustrated in FIGS. 2-2A by no means limits the location of the peak of the pre-condenser lens field to be in front of the emitter 51. In accordance with other embodiments of the present invention, the peak of the magnetic field can be on or either above or below the apex of the emitter for it to achieve the same effect.

The magnetic field of the pre-condenser lens 54a collimates the electron beams immediately after they leave the emitter surface, and as a result the virtual source size and electron beam angular intensity are adjusted.

Below the pre-condenser lens 54a is the condenser lens 54b. For this particular embodiment, a magnetic type lens is employed as the condenser lens, although this is not required by the present invention. The magnetic circuits of the lenses 54a and 54b may be bundled together and share a common lens element 55 for a compact design. Condenser lens 54b is configured so that the magnitude of its magnetic field in the space between the emitter 51 and the extractor electrode 53 is insignificant, thus will not appreciably affect the electron trajectory and therefore the virtual source size. In accordance with a particular embodiment, the magnetic field at the apex of the emitter 51 contributed by the condenser lens 54b, will not be larger than about 0.0035 Tesla when activated at a minimum strength for practical applications.

Adjustment of the pre-condenser lens 54a provides a different virtual source size and beam angular intensity for the condenser lens 54b. When combined with a probe forming objective lens 59, this allows a different set of final probe size vs. current curve to be obtained. Thus through suitable combination of the strength of lenses 54a and 54b, along with selection of a suitable size of the probe forming objective aperture 58, various combination of the final probe size and probe current can be obtained in a range sufficient for most electron beam applications.

Figure 3:
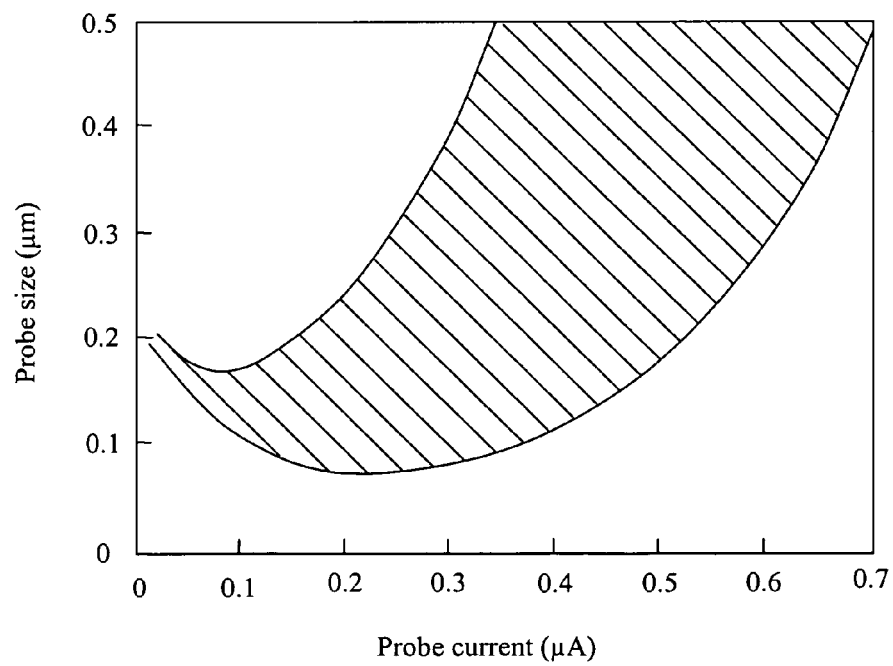
FIG. 3 shows one example of a probe size vs. probe current combination map which is obtainable through an embodiment of the present invention.

FIG. 3 shows one example of such a probe size vs. probe current combination map, in which any point in the shaded area can be obtained by selecting suitable excitations of the pre-condenser lens 54a and the condenser lens 54b. In FIG. 3 only the map available for a single objective aperture 58 is shown for illustration. By selecting different objective aperture sizes, other sets of maps can be made available. Note that the particular values shown in this FIG. 3 by no means limit the scope of the present invention to this set of values of probe size and current. Within the scope of the present invention, by matching the electron gun to different probe forming objective lenses 59 and apertures 58, different sets of probe size and current can be obtained.

Also within the scope of the present invention, an electrostatic type of lens can be employed for condenser lens 54b. In such an embodiment, the electrostatic condenser field of the lens 54b can either be serially arranged in physical space with respect to the magnetic condenser field of the pre-condenser lens 54a, or can be superimposed in part or whole. A magnetic type of condenser lens 54b is employed because it has lower lens aberrations, and is suitable for obtaining smaller probe size while providing larger probe current for applications demanding this feature.

Variations other than those specifically described above will be apparent to persons of skill in the art. These equivalents and alternatives are included within the scope of the present invention. Therefore, the scope of this invention is not limited to the embodiments described, but is defined by the following claims and their full scope of equivalents.

What is claimed is:

1. An apparatus comprising:
   an electron emitter surrounded by an electrode;
   an extraction electrode; and
   a double lens assembly comprising,
      a magnetic immersion type pre-condenser lens configured to generate a magnetic field and immerse the emitter in a strong part of the magnetic field, and
      a magnetic non-immersion condenser lens following the pre-condenser lens.

2. The apparatus of claim 1 further comprising a post-extraction accelerator.

3. The apparatus of claim 1 further comprising a probe forming objective lens.

4. The apparatus of claim 1 wherein the pre-condenser lens is configured to collimate the electron beam to increase an angular intensity while enlarging a virtual source size.

5. The apparatus of claim 1 wherein the condenser lens is positioned far enough from the emitter so that its action does not significantly affect a virtual source.

6. The apparatus of claim 1 wherein the condenser lens is positioned far enough from the emitter so that a magnetic field at an apex of the emitter contributed by the condenser lens will be about 0.0035 Tesla or less.

7. The apparatus of claim 1 wherein the pre-condenser lens and the condenser lens are configured so that through suitable combination of their lens strength, along with a selection of probe forming objective aperture size, various combinations of a final probe size and a probe current can be produced in combination with a probe forming objective lens.

8. The apparatus of claim 1 wherein the electrode comprises a suppressor electrode and the electron emitter comprises a Schottky emitter surrounded by the suppressor electrode.

9. The apparatus of claim 1 wherein the electrode comprises a suppressor electrode and the electron emitter comprises a thermal field emitter surrounded by the suppressor electrode.

10. The apparatus of claim 1 wherein the electrode comprises a shielding electrode and the electron emitter comprises a cold field emitter surrounded by the shielding electrode.

11. The apparatus of claim 1 wherein magnetic circuits of the pre-condenser lens and the condenser lens are bundled together and share a common lens element.

12. A method of generating an electron beam probe, the method comprising:
   providing an electron emitter;
   providing an electrode surrounding the emitter;
   providing an extraction electrode;
   providing a double lens assembly comprising a magnetic immersion type pre-condenser lens followed by a magnetic condenser lens;
   causing the pre-condenser lens to generate a magnetic field and immerse the emitter in a strong part of the magnetic field;
   causing the condenser lens to condense the electron beam;
   providing a final probe forming objective lens; and
   causing the condensed electron beam to be focused into a final electron beam probe by the probe forming objective lens.

13. The method of claim 12 wherein the pre-condenser lens is configured to collimate the electron beam to increase an angular intensity while enlarging a virtual source size.

14. The method of claim 12 wherein the condenser lens is positioned far enough from the emitter so that action of the condenser lens does not significantly affect a virtual source.

15. The method of claim 12 wherein the condenser lens is positioned far enough from the emitter so that a magnetic field at an apex of the emitter contributed by the condenser lens will be about 0.0035 Tesla or less.

16. The method of claim 12 comprising adjusting the pre-condenser lens, the condenser lens, the final probe forming objective lens, and selecting a final probe forming objective aperture producing various combinations of a final probe size and a probe current.

* * * * *